(12) United States Patent
Yang et al.

(10) Patent No.: US 9,048,879 B1
(45) Date of Patent: Jun. 2, 2015

(54) ERROR CORRECTION SYSTEM USING AN ITERATIVE PRODUCT CODE

(75) Inventors: Shaohua Yang, San Jose, CA (US);
Zining Wu, Los Altos, CA (US);
Gregory Burd, San Jose, CA (US);
Xueshi Yang, Cupertino, CA (US);
Hongwei Song, Longmont, CO (US);
Nedeljko Varnica, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 266 days.

(21) Appl. No.: 13/586,710

(22) Filed: Aug. 15, 2012

Related U.S. Application Data

(62) Division of application No. 11/937,389, filed on Nov. 8, 2007, now Pat. No. 8,255,763.

(60) Provisional application No. 60/864,874, filed on Nov. 8, 2006.

(51) Int. Cl.
*H03M 13/29* (2006.01)
*H04L 1/00* (2006.01)

(52) U.S. Cl.
CPC ......... *H03M 13/2945* (2013.01); *H04L 1/0065* (2013.01)

(58) Field of Classification Search
CPC ............... H03M 13/2909; H03M 13/2945; H03M 13/2957; H03M 13/3746; H03M 1/0065; H03M 13/098; H03M 13/1102; H03M 13/1515; H03M 13/23; H04L 1/0065
USPC .......................... 714/755, 758, 762
See application file for complete search history.

(56) References Cited

U.S. PATENT DOCUMENTS

| | | | |
|---|---|---|---|
| 6,367,049 B1 * | 4/2002 | Van Dijk et al. | 714/761 |
| 6,421,804 B1 | 7/2002 | Lee | |
| 6,487,693 B1 | 11/2002 | Kim et al. | |
| 6,924,754 B2 | 8/2005 | Seki | |
| 7,100,101 B1 | 8/2006 | Hemphill et al. | |
| 7,188,295 B2 * | 3/2007 | Van Dijk et al. | 714/755 |

(Continued)

OTHER PUBLICATIONS

Jingbo Gao; Manli Zhou, "Rate-compatible punctured low-density parity-check codes with bit-interleaved coded modulation," Intelligent Signal Processing and Communication Systems, 2005. ISPACS 2005. Proceedings of 2005 International Symposium on , vol., no., pp. 421, 424, Dec. 13-16, 2005.*

(Continued)

*Primary Examiner* — Cynthia Britt

(57) ABSTRACT

An error correction system includes an iterative code that employs an interleaved component code and an embedded parity component code. In some embodiments, on the transmission side, input signals received at an input node are encoded based on the interleaved code, which encodes an interleaved version of the input data to produce a first set of codewords. At least a portion of the first set of codewords preferably is divided into a plurality of symbols which are encoded based on the embedded parity code to provide encoded data. Similarly, in some embodiments, on the receiving side, received data are detected to produce detected information and soft outputs. The detected information is decoded based on the embedded parity code to obtain decoded information. The decoded information preferably is used, together with other soft information, by an interleaved decoder to generate reliability metrics for biasing a subsequent decoding iteration.

18 Claims, 16 Drawing Sheets

(56) References Cited

U.S. PATENT DOCUMENTS

| | | | |
|---|---|---|---|
| 7,861,131 | B1 | 12/2010 | Xu et al. |
| 7,975,207 | B2* | 7/2011 | Hwang et al. ............ 714/769 |
| 8,028,216 | B1 | 9/2011 | Yeo et al. |
| 8,537,918 | B2* | 9/2013 | Park et al. ............ 375/265 |
| 2004/0243917 | A1 | 12/2004 | Suh et al. |
| 2005/0154959 | A1* | 7/2005 | Van Dijk et al. ............ 714/758 |
| 2005/0283708 | A1 | 12/2005 | Kyung et al. |

OTHER PUBLICATIONS

Dorfman, V.; Wolf, J.K., "Postprocessing using a single-parity interleaved block code for a Viterbi detector," Magnetics, IEEE Transactions on , vol. 40, No. 4, pp. 3090, 3092, Jul. 2004.*

A Tensor-Product Parity Code for Magnetic Recording, Feb. 2006.

Adrat, M. et al, Iterative source-channel decoder using extrinsic information from softbit-source decoding, Acoustics, Speech, and Signal Processing, 2001, Proceedings. (ICASSP '01). 2001 IEEE International Conference, vol. 4, pp. 2653-2656, 2001.

Bosco, G., et al, "Decreasing the complexity of LDPC iterative decoders," Communications Letters, IEEE, vol. 9, No. 7, pp. 634-636, Jul. 2005.

Vogt, J.; Finger, A.; "Increasing throughput of iterative decoders," Electronics Letters, vol. 37, No. 12, pp. 770-771, Jun. 7, 2001.

\* cited by examiner

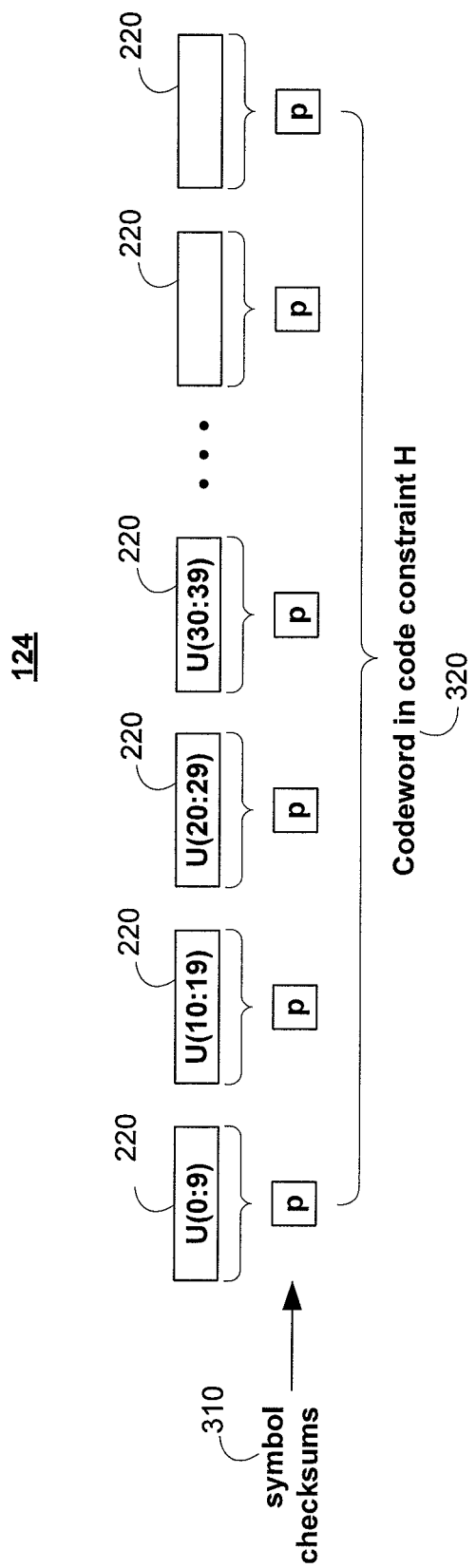

ERROR CORRECTION SYSTEM USING AN ITERATIVE PRODUCT CODE

CROSS-REFERENCE TO RELATED APPLICATIONS

This application is a divisional of copending U.S. patent application Ser. No. 11/937,389, filed Nov. 8, 2007, which claims the benefit under 35 U.S.C. §119(e) of U.S. Provisional Patent Application No. 60/864,874, filed on Nov. 8, 2006, the disclosures of which are hereby incorporated by reference herein in their entireties.

BACKGROUND

Embodiments of this invention generally pertain to systems and methods for encoding and decoding user data for communication and/or storage applications to enhance error detection and possibly correction of the data.

Defects in a storage media, or errors in the reading and writing of data from a storage media, may result in data errors. Similarly, transmission of data through a transmission channel may result in errors, because of noise in the transmission channel. However, digital communication and storage systems need to perform accurately and reliably in the presence of these defects and errors. One effective and economical way to achieve this goal is through the use of forward error-correction (FEC) coding. Generally speaking, FEC coding is a type of digital signal processing that improves data reliability by introducing a known constraint into a data sequence prior to transmission or storage. This constraint enables a receiving system to detect and possibly correct errors caused by corruption from the channel and the receiver without requesting retransmission of the original information. In a digital system that employs FEC coding, a digital information source sends a data sequence to an encoder. The encoder inserts "redundant" (or parity) bits, thereby outputting a longer sequence of code bits, called a codeword. Such codewords can then be transmitted to a receiver, which uses a suitable decoder to extract the original data sequence. The decoder generally decodes the data, generates an error polynomial, and uses the error polynomial to determine corrections to the data.

In order to improve data transmission reliability, an FEC coding scheme may include two or more codes having different abilities to correct different types of errors in the data. For example, errors may be randomly distributed in a data set, or the errors may be burst errors, in which case they are grouped together. In magnetic recording, for example, a common FEC coding architecture may include a Reed-Solomon (RS) code designed to correct burst errors in the data and another code, such as, for example, a parity check code to correct randomly distributed bit errors in the data. The number and type of errors that can be corrected by the RS code depends on the characteristics of the code. For example, a Reed-Solomon code that takes k data symbols and adds parity symbols to make an n-symbol codeword including n–k parity symbols can typically correct up to t symbol errors, where $2t=n-k$. Thus, the RS code requires two redundancy symbols to correct each symbol error. In order to increase the error correcting capabilities of the RS code, the number of redundant symbols must be increased. The use of additional redundant symbols, however, decreases both the effective bandwidth of a transmission system and the effective storage capacity of a storage system. Moreover, the use of additional redundant symbols increases the amount of processing performed by both the transmitting unit and the receiving unit to create or interpret the redundant symbols.

There is therefore a continued interest in developing effective techniques for reducing the number of errors, and in particular, the number of symbol errors presented at the front end of a decoder, such as an RS decoder.

SUMMARY

An error correction system is provided which includes an iterative product code that employs an interleaved component code and an embedded parity component code. In one embodiment, on the transmission side, input signals received at an input node are encoded based on the interleaved code, which encodes an interleaved version of the input data to produce a first set of codewords. At least a portion of the first set of codewords is divided into a plurality of symbols which are encoded based on the embedded parity code to provide encoded data. On the receiving side, received data are detected to produce detected information and soft outputs. The detected information is decoded based on the embedded parity code to obtain decoded information. The decoded information is used, together with other soft information, by an interleaved decoder to generate reliability metrics for biasing a subsequent decoding iteration. Methods for encoding and decoding are also provided.

Further features of the invention, its nature and various advantages, will be more apparent from the accompanying drawings and the following detailed description of the various embodiments.

BRIEF DESCRIPTION OF THE DRAWINGS

FIG. 3 shows an exemplary embedded parity code encoder in accordance with one aspect of the invention;

DETAILED DESCRIPTION

The systems and methods of this invention generally relate to detecting and, in some cases, correcting errors associated with the communication of information using an interleaved code and an embedded parity code. As used herein, an interleaved code refers to a code having an associated encoder that includes an interleaver at the front-end of the encoder for presenting an interleaved version of the input data for encoding by the encoder. As used herein, an embedded parity code refers to a code that includes an inner code and an outer code, the inner code generating a first of set codewords having associated redundancy data, the redundancy data forming a codeword in the outer code. In one embodiment, the outer code may be an iterative code. As used herein, iterative codes are codes with associated decoders having multiple decoding stages that successively refine estimates of detected information based, at least in part, on reliability metrics generated for previous estimates of the detected information. As used herein, "communication" or "transmission" may refer to any activity on a communication or a storage channel, such as, for example, transmitting bits from a source to a destination, reading stored information from a storage medium or writing information to a storage medium. As used herein, "information" may refer to digits (which may be binary or non-binary) that may be physically embodied in any of a number of ways that are known in the art. Information to be encoded will be referred to herein as "user information," and information produced by an encoder based on user information will be referred to as "encoded information." For simplicity, it will be assumed that user information processed using embodiments of the invention is made up of binary digits (bits), however, non-binary digits may be used without departing from the scope of the invention. User information may include information that has already been encoded by some type of source encoder, such as, for example, a Reed-Solomon (RS) encoder, and as result, may be represented as a sequence of symbols, each symbol including a group of bits.

Figure 1:
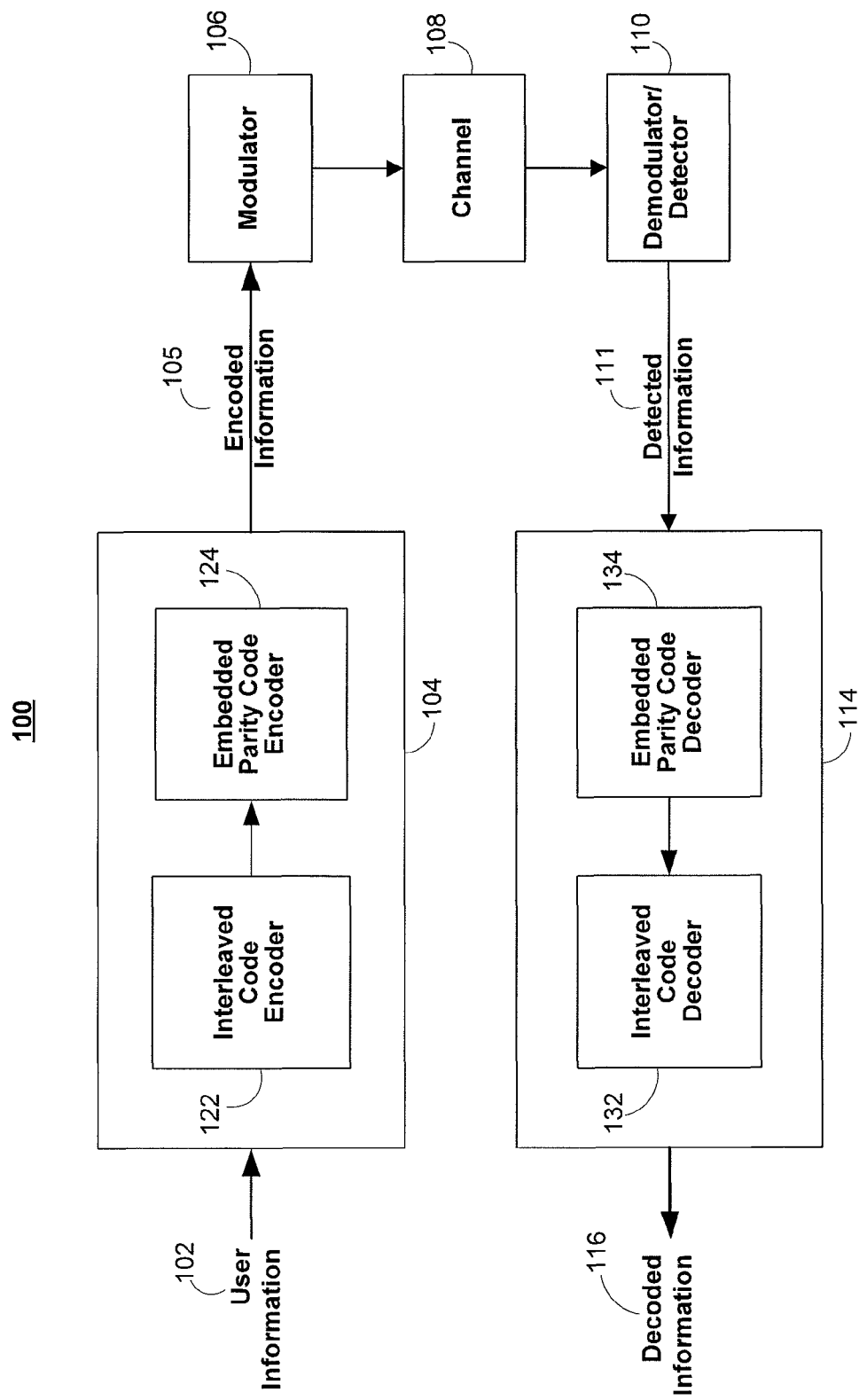
FIG. 1 is a block diagram of an exemplary transmission or storage system 100 in accordance with one aspect of the invention.

FIG. 1 is a block diagram of an exemplary iterative error correction system 100 in accordance with one aspect of the invention. System 100 includes user information 102 that is intended for communication. The user information 102 may include a series of datawords. As used herein, a "dataword" refers to a group of bits suitable for encoding as a unit by an encoder. Datawords in user information 102 may be encoded by encoder 104, which preferably includes interleaved code encoder 122 and embedded parity code encoder 124, to generate encoded information 105. Encoded information 105 may be made up of a series of codewords. Encoded information 105 may be modulated by modulator 106, which may perform electric-, magnetic-, or optical-based modulation, or another type of modulation. Modulator 106 transforms encoded information 105 into one or more signals (not shown) that may be communicated over communications channel 108. As used herein, "channel" refers to media, devices, and/or processing stages that occur between modulator 106 and detector 110, and may correspond to a particular path of media/devices through which a signal may flow, a particular wavelength or time slot which a signal may utilize, and/or another multiple access scheme. For example, in FIG. 1, channel 108 may correspond to storage, and write and read components of a disk drive, including a magnetic storage medium, a disk-drive read/write head, the read or write paths of the signal to be stored, and other storage system components. In some cases, the term "channel" as used herein may also include modulator 106 and detector 110. While in channel 108, the signal may encounter error-producing phenomena, such as, for example, device physical failure, device electrical failure, signal interference, and/or data loss due to buffer overflow. The interference signals and other error-producing phenomena in a channel 108 will be referred to herein as "noise."

With continuing reference to FIG. 1, the signals on channel 108 may be received by detector 110. Detector 110 attempts to determine or detect the encoded information 105 from the received signal to obtain detected information 111. Detector 110 preferably is a soft output detector, such as for example, a soft output Viterbi algorithm (SOVA) detector or a Bahl Cocke Jelinek Raviv (BCJR) detector. As a result, detected information 111 may include a hard decision which may represent detected codewords or bits, and reliability metrics which may indicate the likelihood of error in the detected bits. As used herein, "reliability metrics" (sometimes referred to as "soft information") refer to numerical quantifications, such as probabilistic quantifications, that indicate the likelihood of error or the confidence in the value of a detected or decoded bit. A small reliability metric value for a bit may be indicative of an increased likelihood of an error event associated with that bit. If there are no errors in the detected codewords, the detected codewords should match encoded information 105. If there are errors, however, detector 110 and/or decoder 114 may be able to correct some or all of the errors based, at least in part, on the reliability metrics generated by detector 110. In some embodiments, the input to detector 110 may be an equalized signal, such as a finite impulse response (FIR) filter, and detected information 111 may include a non-return-to-zero (NRZ) output.

Detected information 111, including the reliability metrics, may be provided to decoder 114. In some embodiments, detected information 111 may be provided to a post-processing module (not shown) which may process the detected information prior to decoding by decoder 114 to reduce the number and/or types of errors presented to decoder 114. Decoder 114 attempts to recover user information 102 from detected information 111 to obtain decoded information 116. Decoded information 116 may include decoded bits as well as reliability metrics associated with the decoded bits. If there are no errors in decoded information 116, the decoded bits should match user information 102. If there are errors, however, decoder 114 and/or a post-processing unit may be able to correct some or all of the errors using reliability metrics included in decoded information 116. In one aspect of the invention, decoder 114 may be an iterative decoder and may perform more than one decoding iteration on each channel output. Decoder 114 preferably includes embedded parity decoder 134 and interleaved decoder 132, which will be described in greater detail below.

In addition to the functional blocks shown in FIG. 1, embodiments of this invention may include other components. For example, datawords in user information 102 may be encoded by one or both of a Reed Solomon error-correcting code (RS-ECC) and a run-length-limited (RLL) code before being encoded by encoder 104. Alternatively or additionally, where appropriate, codewords in encoded information 105 may be further encoded by one or both of an RS-ECC and an RLL code before being modulated by modulator 106. More generally, when multiple encoders are used, any suitable ordering of the encoders is possible. Decoders corresponding to the multiple encoders, such as a Reed Solomon error-correcting decoder and/or a run-length-limited decoder, may then be used in addition to decoder 114 to recover the source signal.

In one embodiment of the invention, user information of length $k_1k_2$ bits to be encoded is arranged into a $k_2$-by-$k_1$ matrix, thus forming $k_1$ one-dimensional data blocks (along the column dimension) of $k_2$ bits each, where $k_1$ and $k_2$ are integers greater than 0. Each $k_2$-bit data block preferably is further subdivided into m symbols of s bits each. The symbol size s preferably corresponds to an error correction symbol size of a prior encoder, such as for example, a Reed Solomon encoder. However, any suitable symbol size may be used. The data are then preferably encoded in two steps. At the first step of encoding, interleaved encoder 122 preferably encodes interleaved $k_1$-bit datawords (there are $k_2$ such datawords) along a row dimension, each dataword including at least one bit from each of the $k_1$ data blocks to obtain $n_1$ data blocks of $k_2$ bits each, the $n_1$-$k_1$ data blocks corresponding to redundancy data generated by interleaved encoder 122. As will be described in greater detail below, this first step of encoding may include several stages and sub-stages of encoding.

At the second step of encoding, embedded parity encoder 124 preferably encodes the entire set of $k_2$-by-$n_1$ bits as one codeword. However, in some embodiments, the embedded parity encoder may generate a stream of codewords based on a stream of datawords in the $k_2$-by-$n_1$ block. In some embodiments, only information bits may be encoded by embedded parity (EP)encoder 124. As a result, this second step of encoding may not include the $n_1$-$k_1$ redundancy data blocks generated by interleaved encoder 122. As will be described in greater detail below, this second step of encoding may include several stages and sub-stages of encoding. In addition, in some embodiments, the number of parity bits added by EP encoder 124 may not be a multiple of the number of columns, $n_1$. Therefore, in these embodiments, the encoded output of EP encoder 124 might not be an integral number of "data blocks" and/or the encoded data blocks may not be of equal length. Furthermore, in some embodiments, the first and second encoding steps may occur substantially concurrently or in reverse order. However, for simplicity and ease of explanation, it will be assumed in the sections that follow that the first and second steps of encoding occur sequentially.

Figure 2:
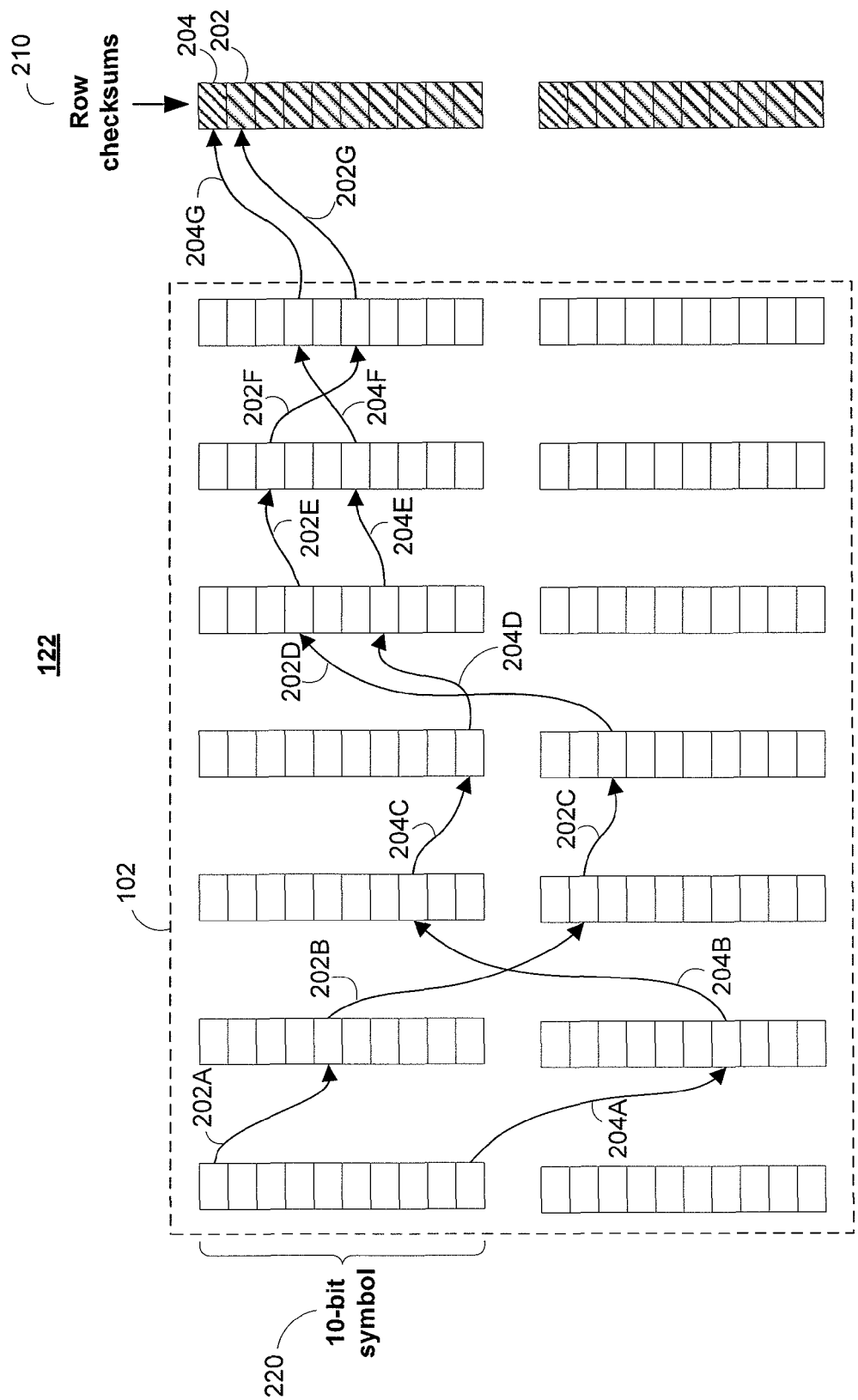
FIG. 2 shows an exemplary interleaved encoder in accordance with one aspect of the invention.

FIG. 2 shows an exemplary interleaved encoder 122 in accordance with one aspect of the invention. Illustrative interleaved encoder 122 encodes 140 information bits arranged into seven data blocks ($k_1$=7) of 20 bits each ($k_2$=20). In this illustrative embodiment, each data block preferably includes 2 10-bit symbols (m=2, and s=10). This configuration is merely illustrative, other arrangements may be used. In particular, it is assumed that user information 102 is transmitted column-wise and as a result, data blocks in FIG. 2 are arranged column-wise. However, where user information is transmitted row-wise, data blocks in FIG. 2 may be arranged row-wise. The illustrative 140-bit user information 102 encoded in FIG. 2 may correspond to one of multiple sectors of user information 102 to be encoded. Interleaved encoder 122 preferably encodes in a dimension that is orthogonal to the dimension of the data blocks, and as a result, in this illustrative embodiment, interleaved encoder 122 operates row-wise. Because interleaved encoder 122 operates row-wise, the interleaved code may be referred to sometimes as the row component code of the product code.

Interleaved encoder 122 preferably encodes an interleaved version of user information 102. For example, all bits connected by interleavers 202A through 202F form a dataword associated with parity bit 202, while all bits connected by interleavers 204A through 204F form a dataword associated with parity bit 204. Each bit in user information 102 preferably is included in at least one interleaved dataword, and each interleaved dataword preferably includes at least one bit from each of the seven data blocks. In some embodiments, each interleaved dataword includes exactly one bit from each data block and each bit in user information 102 participates in exactly one interleaved dataword. In the illustrative embodiment of FIG. 2, each interleaved dataword is encoded based on an SPC code to enforce an even parity constraint. However, any suitable coding mechanism, such as, for example, a low density parity check (LDPC) code, or other multi-bit coding schemes may be used.

The interleaver in interleaved encoder 122 preferably is designed so that interleaved encoder 122 encodes an interleaved version of user information 102 without scrambling the bits for transmission. The interleaver preferably interleaves bits at the front-end of interleaved encoder 122 such that no two adjacent bits in the same row of user information 102 are included in the same dataword. In some embodiments, such as when an LDPC code is employed, each column may be interleaved separately and the resultant data matrix encoded along the row dimension. Alternatively or additionally, in some embodiments, a standard interleaver that scrambles code bits among multiple blocks so that they are not contiguous when transmitted may be used. In these embodiments, the standard interleaver scrambles the bits for transmission and not just for encoding by the interleaved encoder.

An advantage of interleaving is to break down channel dependencies. In particular, the interleaver provides an additional dimension of diversity to the error correction system as the encoded output of interleaved encoder 122 may be more robust to burst errors than the output of embedded parity encoder 124, which may encode sequential symbols in their natural order. For example, because the data generally is written onto storage or transmission media by columns, and channel errors tend to be bursts that affect several consecutive bits, interleaving typically improves error detection by dispersing burst errors across many symbols. Errors dispersed among multiple symbols are less likely to "cancel out" each other and are thus, more detectable and/or correctable. The overall complexity of the interleaver may be adjusted based on the user data and the nature of the channel used for communication or storage. For example, in some embodiments, the interleaver may simply select rows of bits for encoding in the order presented in each respective row of user information 102. In some embodiments, the interleaver may be a predetermined lookup table. In some embodiments, the control logic may generate an interleaving order based, for example, on hard-coded logic, a state machine, an address generator, on firmware embedded in the control logic.

The encoded output of interleaved encoder 122 preferably is further encoded by embedded parity (EP) encoder 124 to produce encoded information. FIG. 3 shows an illustrative EP encoder 124 in accordance with some embodiments of the invention. EP encoder 124 preferably encodes each symbol 220 based on an inner code to produce one or more checksums 310 for each symbol. The symbols 220 preferably are encoded in a sequential order that corresponds to the order of transmission of the symbols. In some embodiments, symbols 220 may include symbols formed by redundancy information generated by interleaved encoder 122. The symbol checksums 310 may be generated using any suitable parity code such as, for example, a single-parity check (SPC) code or a multi-bit parity check code.

Regardless of the number of checksums per symbol or the number of bits per checksum, the bits in all checksums 310 for all symbols 220 may form a codeword 320 that satisfies an outer code constraint of the embedded parity code, the outer code constraint defined by a parity-check matrix H. As used herein, a parity-check matrix H for a code is a matrix that may be used to define all valid codewords of the outer code. H may be a parity-check matrix for any suitable type of code such as, for example, an LDPC code, a turbo code, a linear block code, or a convolutional code. In some embodiments, H may define an iterative code. Detailed discussions of embedded parity encoding/decoding are provided in U.S. patent application Ser. No. 11/449,066, filed Jun. 7, 2006 and U.S. patent application Ser. No. 11/809,670, filed Jun. 1, 2007, which are hereby incorporated herein by reference in their entireties.

Figure 4A:
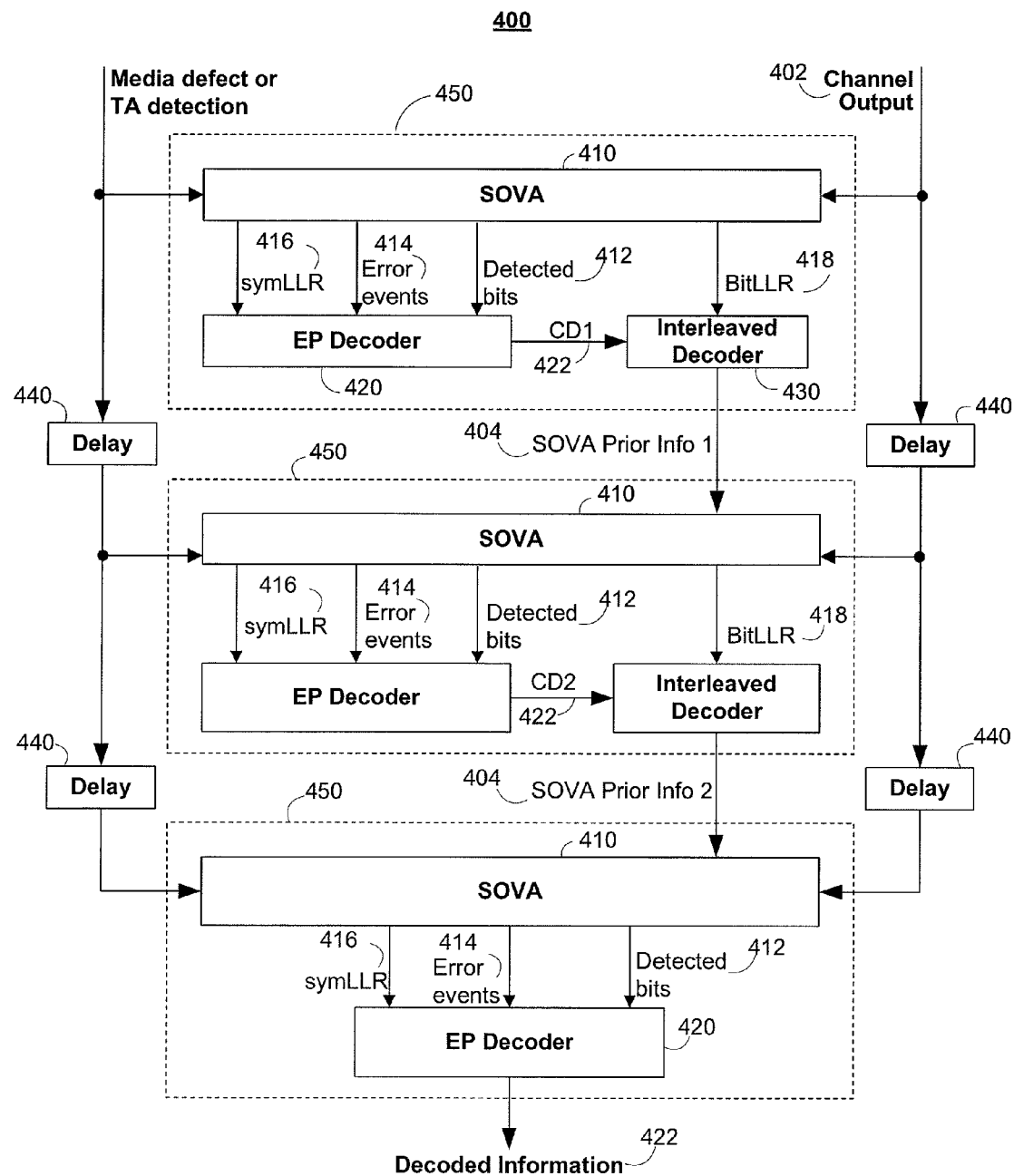
FIG. 4A is a block diagram of an exemplary iterative decoder 400 in accordance with one aspect of the invention.

The encoded output of embedded parity code encoder 124 may be passed through a transmission channel, where it may be corrupted by noise in the channel and received at the input of a detector such as, for example, detector 110 of FIG. 1. The received data may be detected and decoded to recover the user information. FIG. 4A includes illustrative iterative decoding system 400 which may be used to iteratively decode detected information encoded in accordance with the present invention. Generally speaking, iterative decoders include decoders which iteratively refine estimates of a codeword based at least in part on reliability metrics obtained from a previous iteration. Reliability metrics fed back from a prior decoding iteration to bias a current decoding stage will be referred to herein as "prior soft information." System 400 preferably passes the detected information through successive decoding iterations, each iteration including one or more decoding stages to recover redundant information which may, in turn, be used to recover the user information. Exemplary system 400 includes three channel iterations 450, although any suitable number of iterations may be used. In some embodiments, decoding terminates after the decoded information converges. Convergence may be user-determined. For example, in some embodiments, iterative decoding system 400 may be configured to terminate decoding after a predetermined maximum number of iterations. In these embodiments, an iterations counter may be decremented after each iteration.

Each decoding iteration 450 includes soft-output Viterbi algorithm (SOVA) detector 410 although other detectors, such as, for example, a Bahl Cocke Jelinek Raviv (BCJR) detector, may be used. Inputs to detector 410 may include channel output 402 and, for each iteration after the first, prior soft information 404. Prior soft information 404 is new soft information fed back from a preceding decoding iteration (e.g., from decoders 420 or 430) in order to bias a subsequent detection and/or decoding iteration. Prior soft information 404 may be viewed, generally, as a measure of the probability of accuracy of each detected bit as determined by one or more preceding decoding iterations. For the first decoding iteration, no prior information 404, or alternatively, a predetermined value for prior information 404, such as zero or some other small metric, may be used. Channel output 402 may be any set of values that are suitable for detection by detector 110. For example, the channel output response may be an equalized finite impulse response (FIR) filter matched to detector 110. Detector 410 detects channel output 402 to generate detected information. The detected information preferably includes detected bits 412, error events 414, bit reliability metrics 418, and symbol checksum reliability metrics (symLLR) 416. Error events 414 may include error patterns, which may indicate bit error locations in detected bits 412. SymLLR 416 preferably is a signed reliability metric generated by SOVA detector 410 on the hidden (embedded) parity checksums associated with each detected symbol in the detected information, which may be viewed as a series of detected symbol codewords. As described above, the symbol parity checksum can be defined by multi-parity code. Therefore, if, for example, each symbol has two parity checksums, SOVA detector 410 preferably generates two symLLR 416's per symbol. Other reliability metrics may also be generated. Detected bits 412 may be generated by a hard decision generator such as, for example, a Viterbi detector included in detector 410.

The outputs of detector 410 are provided to EP decoder 420 for decoding. As described with reference to FIG. 4B, EP decoder 420 preferably recovers the symbol checksums and uses stored most likely error events together with the recovered checksums to recover the user information in the detected symbols. In some embodiments, in all but the final decoding iteration 450, the decoded output of EP decoder 420 is provided to interleaved decoder 430. Interleaved decoder 430 preferably generates prior soft information 404 for the decoded information to be used to refine estimates of the decoded information in subsequent decoding iterations. In the final decoding iteration, the output of EP decoder 420 preferably is tapped as the decoded output 422 for decoder 400. One reason for tapping decisions out of EP decoder 420, rather than from interleaved decoder 430, is that, in the illustrative embodiment in FIG. 4A, EP decoder 420 generally operates on RS ECC symbols, which may have limited error propagation properties and limit mis-correction. In this illustrative embodiment, because interleaved decoder 430 acts mainly as a message passing decoder for subsequent decoding iterations, the final decoding iteration preferably does not include an interleaved decoder 430. However, where necessary, the final iteration may also include an interleaved decoder 430. Each decoding iteration after the first preferably uses a delayed version of channel output 402. The duration of the delay introduced by each delay element 440 may be predetermined or dynamically adjusted to coincide with the duration of each decoding iteration.

Figure 4B:
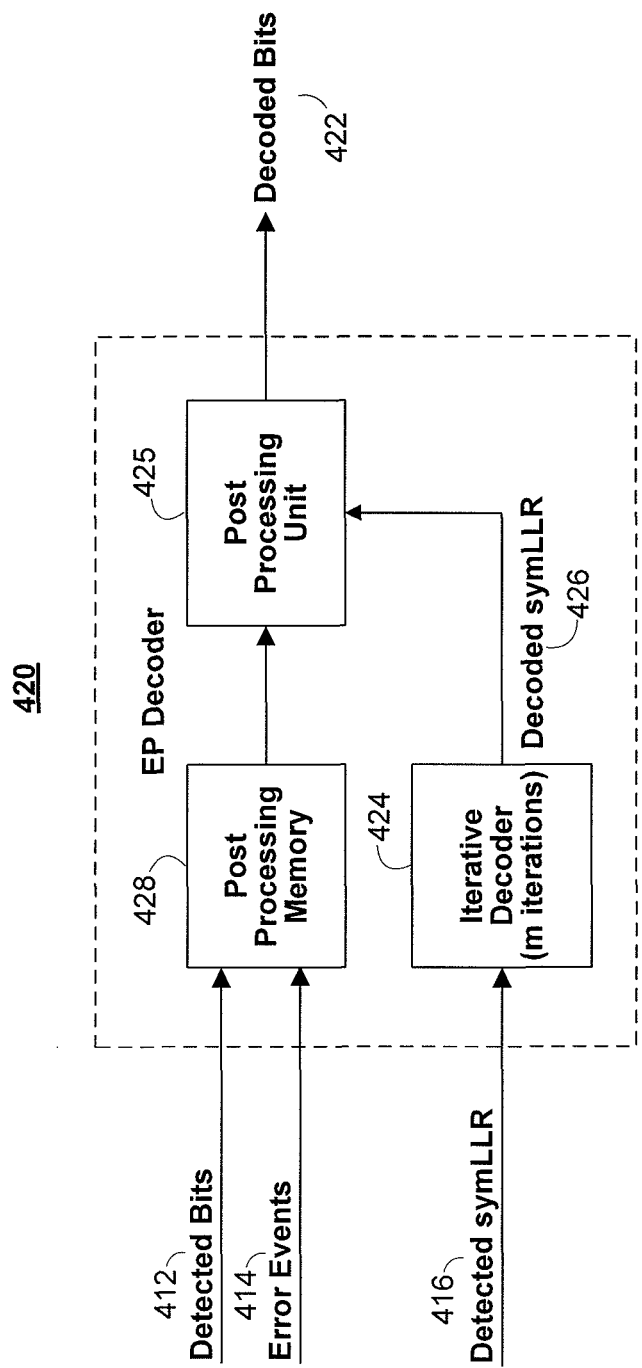
FIG. 4B is a block diagram of an exemplary column decoder that may be employed by iterative decoder 400 in accordance with one aspect of the invention.

FIG. 4B shows illustrative EP decoder 420 which may be employed in system 400 in accordance with some embodiments of the invention. Exemplary EP decoder 420 includes iterative decoder 424, and post-processing unit 425 coupled to post-processing memory 428. The type of iterative decoder 424 used may depend on the outer code constraint H associated with the embedded parity code. For example, a message passing decoder (e.g., a Sum-Product or a Min-Sum decoder) may be used if H is an LDPC code or a turbo code, and a BCJR or a Viterbi decoder may be used if H is a convolutional code or small linear block code. EP decoder 420 may include other components not shown in FIG. 4B such as, for example, control logic and other internal buffers. EP decoder 420 preferably decodes the detected information using a two-stage process, which may include a first decoding stage to recover the symbol checksums 310 (FIG. 3), and a second decoding stage to recover the symbols 220 (FIG. 3) using the symbol checksums and stored most likely error events.

In the first decoding stage, iterative decoder 424 preferably recovers the symbol checksums based on checksum reliability metrics symLLR 416 generated on the checksums associated with the symbols. The symbol checksum reliability metric for a checksum associated with a particular symbol may be computed based on error events associated with the symbol. In some embodiments, the magnitude of symLLR 416 preferably is computed as the magnitude of the most likely error event associated with the symbol that is likely to corrupt the checksum associated with the symbol. For example, an odd parity error event in a symbol may flip a single parity checksum associated with the symbol, and, therefore, may be considered a candidate error event that may corrupt the symbol's checksum. The sign of symLLR 416 may be determined based on the constituent bits of the symbol and the inner code used to generate the checksum for the embedded parity code. For example, in this illustrative embodiment where the inner code is an SPC code, the sign of the symbol reliability metric for the checksum of a particular symbol may be set to positive if the XOR of all detected bits in the symbol is 1, and negative otherwise. In general, the smaller the magnitude of symLLR 416 associated with the checksum of a particular symbol, the higher the likelihood of error in that particular symbol checksum, and hence the symbol. The checksum associated with each symbol may be iteratively decoded using the detected symLLR 416 based on the column constraint H to determine decoded or corrected symLLR 426. As shown in FIG. 4B, the sign of corrected symLLR 426 represents the corrected parity checksum for the symbol and the magnitude reflects the likelihood of error in the symbol. If the sign of corrected symLLR 426 differs from the sign of the corresponding detected symLLR 416, a parity error is detected in the symbol. This error may be stored in post-processing memory 428 for use by post-processing unit 425 to correct the detected bits 412.

In the second decoding stage by EP decoder 420, corrected symLLR 426 values preferably are provided to processing unit 425 to be used, along with most likely error events obtained from post-processing memory 428, to provide decoded bits 422. If necessary, post-processing unit 425 may derive the corrected symbol checksum for each detected symbol based on the sign of the corresponding corrected symLLR 426 of the symbol.

Figure 4C:
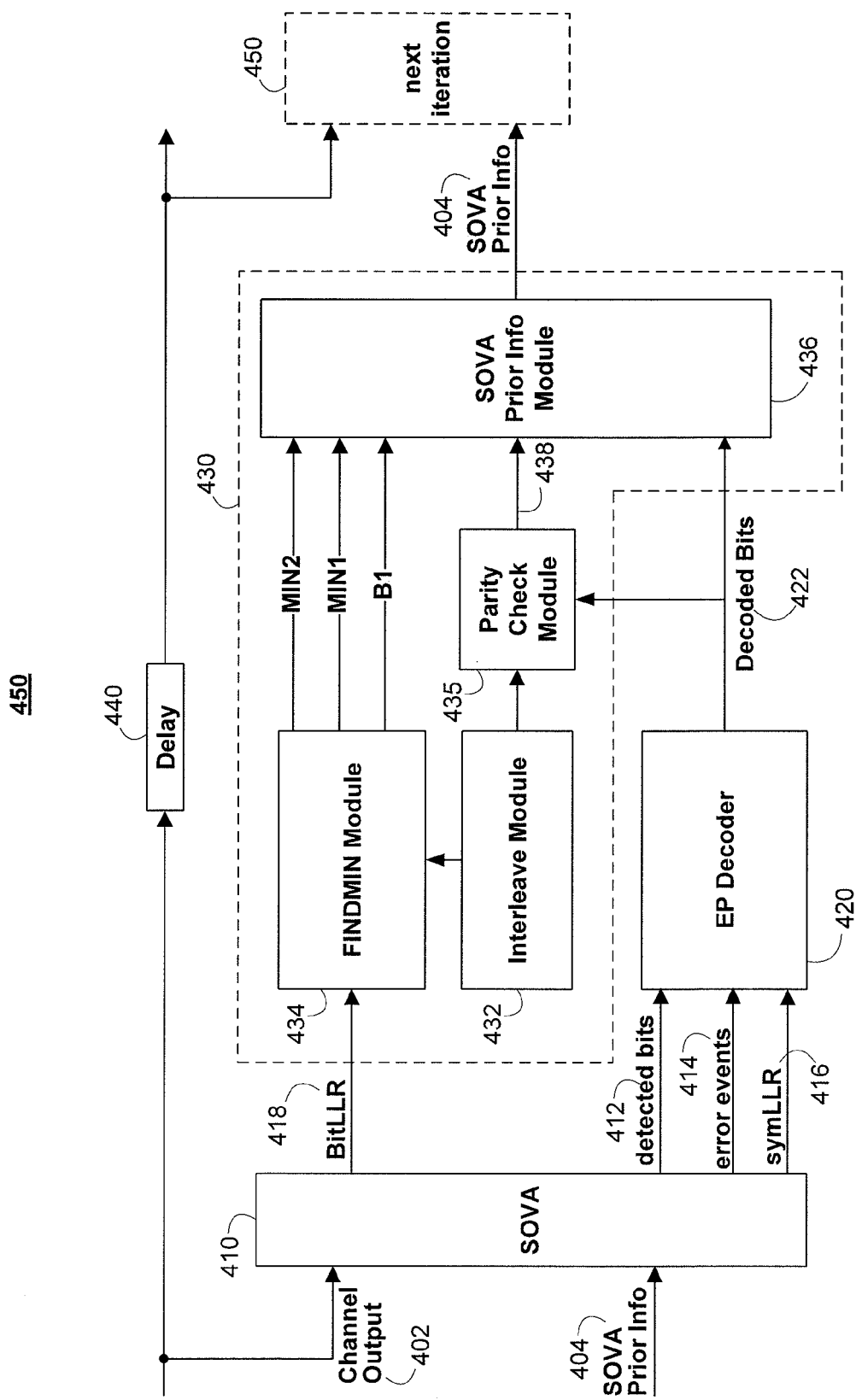
FIG. 4C is a block diagram of an exemplary decoding iteration of iterative decoder 400 including an illustrative row decoder in accordance with one aspect of the invention.

The decoded output 422 of EP decoder 420 may be provided to interleaved code decoder 430, which may generate prior soft information for a subsequent decoding iteration 450 (FIG. 4A). FIG. 4C shows illustrative decoding iteration 450 which includes a more detailed illustrative interleaved code decoder 430. Elements 402, 404, 420, 412, 414, 416, 418, 422, and 440 of FIG. 4C are the same as their respective like-numbered counterparts described in FIGS. 4A and 4B.

Interleaved code decoder 430 includes interleave module 432, FINDMIN module 434, parity check module 435, and prior soft information module 436. Interleave module 432 generates a plurality of interleaved codewords based on a predetermined interleaver that corresponds to the interleaver used by interleaved code encoder 122 (FIG. 2) to encode decoded bits 422. Each interleaved codeword preferably includes an interleaved dataword and redundancy information associated with the interleaved dataword. Each codeword may include the actual bits encoded by the interleaved code or bit indices corresponding to the encoded bits.

The output of interleave module 432 is provided to FINDMIN module 434 and parity check module 435. For each interleaved codeword generated by interleave module 432, FINDMIN module preferably compares the bit reliability metrics 418 associated with the constituent bits to identify two minimum magnitude reliability metrics, denoted by MIN1 and MIN2, where MIN1 the smallest of the two metrics. FINDMIN module 434 also determines the bit index for MIN1 and outputs the bit index as B1. Also for each interleaved codeword generated by interleave module 432, parity check module 435 determines whether a code constraint, such as an even parity constraint, associated with the interleaved code is violated. If the code constraint associated with the interleaved code is not violated by a particular codeword, then the bits in the codeword are likely correct or errors in the codeword are undetectable by the interleaved code. The determination of parity check module 435 is output as parity check status 438. Parity check status 438, decoded bits 422, MIN1, MIN2, and B1 preferably are provided to prior soft information module 436.

Prior soft information module 436 generates prior soft information 404 for each decoded bit to bias decoding of the bit in a subsequent decoding iteration. In this illustrative embodiment, prior information module 436 employs a standard Min-Sum decoding algorithm in each iteration. However, any suitable decoding algorithm may be used. The prior soft information for each bit includes a sign and a magnitude. In a standard min-sum decoding algorithm, the magnitude of prior soft information 404 for a decoded bit preferably is set to MIN1 if the bit index for the decoded bit differs from B1, and MIN2 otherwise. Computing the magnitude of prior soft information 404 by first initializing MIN1 and MIN2 advantageously reduces the total number of comparators as well as computing power required to perform the operation. However, other methods for determining a magnitude for prior soft information 404 may be used.

The sign of prior soft information 404 may be determined based on the parity check status 438 for the codeword associated with the bit. In some embodiments, prior soft information module 436 may select an appropriate sign for prior information 404 to bias the outcome of the next decoding iteration of the bit towards the current value of the bit if the codeword does not violate the interleaved code constraint. Similarly, prior soft information module 436 may select an appropriate sign for prior information 404 to bias the outcome of the next decoding iteration of the bit towards an alternate value of the bit (e.g., to flip the bit) if the codeword violates the interleaved code constraint. For example, let BM be a log-likelihood ratio representing the prior soft information for a bit having a current value A, the possible values being {A,B}, where a positive BM represents a higher likelihood that A was in fact transmitted, and a negative value represents a higher likelihood that B was transmitted. The sign for BM may be positive if the codeword for A does not violate the interleaved code constraint, indicating to a next iteration that A is likely the correct value for the transmitted bit, and negative if the code constraint is violated, indicating to a next iteration that A is likely an incorrect value for the transmitted bit. Detailed description of min-sum decoding is provided in U.S. Pat. No. 7,184,486, issued Feb. 27, 2007, which is hereby incorporated herein by reference in its entirety. In the illustrative embodiment described above, the interleaved code is a simple interleaved SPC checksum. However, other parity codes, including multi-bit parity checks, may be used. Furthermore, where necessary, a more complex interleaved decoder 430 may be used.

Figure 5:
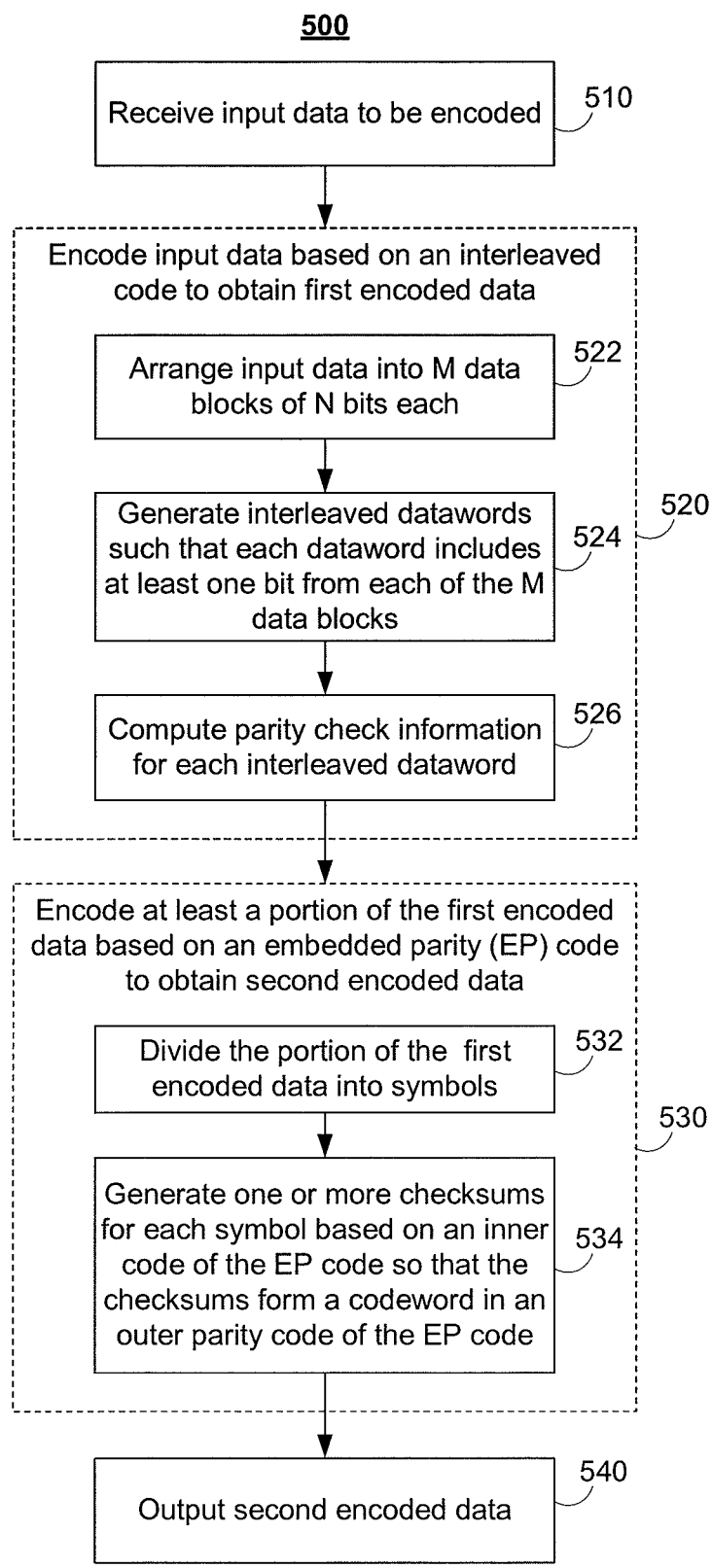
FIG. 5 shows illustrative process 500 for encoding data in accordance with one aspect of the invention.

FIG. 5 shows illustrative process 500 for encoding input data in accordance with one aspect of the present invention. At step 510, input data to be encoded may be received at the input node of an encoder, such as, for example, encoder 104 (FIG. 1). The process continues at step 520 where the input data may be encoded based on an interleaved code to obtain first encoded data. Encoding the data at step 520 may include arranging the input data into M data blocks of N bits each at step 522, where M and N are both integers greater than 0. Interleaved datawords may be generated at step 524 from the data blocks using any suitable encoder such as for example, encoder 122 (FIG. 2). Each interleaved dataword preferably includes at least one bit from each of the M data blocks. In some embodiments, each interleaved dataword may include exactly one bit from each of the M data blocks. The process continues to step 526 where each interleaved dataword is encoded to include parity check information in accordance with a code constraint associated with the interleaved code.

For example, if the interleaved code is a single parity check (SPC) code, a parity bit may be added to each interleaved dataword to force the resultant codeword to an even parity. The output from step 526 (and parent step 520) will be referred to hereinafter as "first encoded data" for clarity. The process continues to step 530.

At step 530, at least a portion of the first encoded data is further encoded based on an embedded parity code to obtain the encoded output of process 500. Encoding the first encoded data at step 530 may include dividing the portion of the data to be encoded into a plurality of symbols at step 532. The symbol length for each symbol preferably corresponds to a symbol length of an error correction code, such as Reed-Solomon code used to pre-process or post-process the data. However, any suitable symbol length may be used. The process continues to step 534 where one or more checksums are generated for each symbol based on inner code of the embedded parity code such that the checksums form a codeword in an outer parity code of the embedded parity code. The encoded output of step 534 (and parent step 530) is output at step 540.

In practice, one or more steps shown in process 500 may be combined with other steps, performed in any suitable order, performed in parallel (e.g., simultaneously or substantially simultaneously) or removed.

Figure 6A:
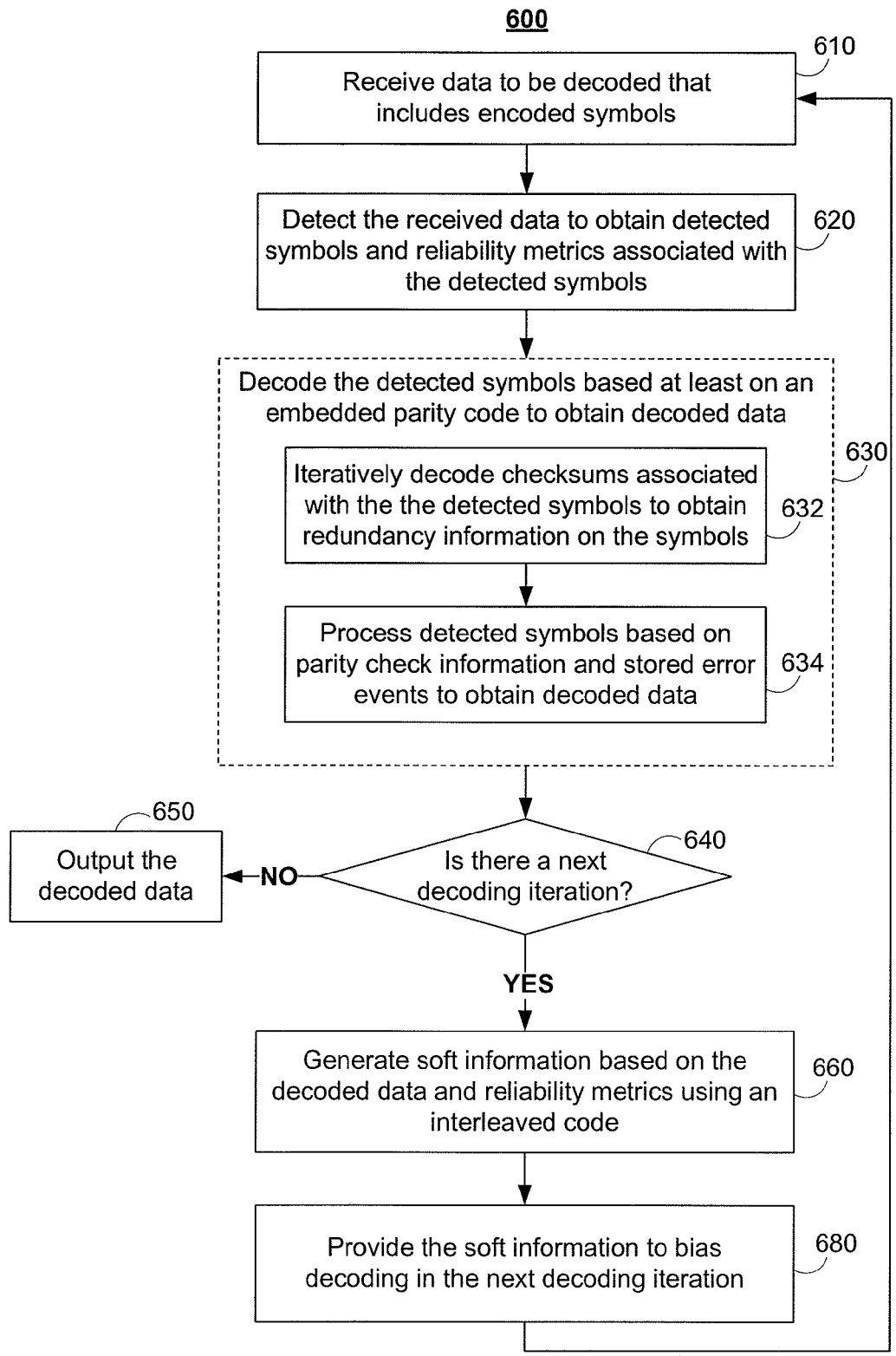
FIG. 6A shows illustrative process 600 for iteratively decoding data in accordance with one aspect of the invention.

FIG. 6A shows illustrative process 600 for iteratively decoding encoded data that preferably includes encoded symbols. For example, process 600 may be used to decode data encoded according to illustrative process 500 of FIG. 5. The process begins at step 610 where data to be decoded may be received at the input node of a decoder such as, for example, decoder 400 (FIG. 4A). The process continues at step 620 where the received data may be detected using for example SOVA detector 410 (FIG. 4A) to obtain detected symbols and reliability metrics. The reliability metrics from step 620 also preferably include reliability metrics on symbol checksums associated with each of the detected symbols. The process continues to step 630 where the detected symbols may be decoded based on an embedded parity code to obtain decoded data. Decoding the detected symbols at step 630 preferably includes iteratively decoding the symbol checksums associated with the detected symbols using reliability metrics generated on the checksums to obtain decoded or corrected checksums at step 632. The process continues to step 634 where the detected symbols may be processed using the corrected checksums and stored error events to correct most likely errors in the symbols to obtain decoded data. At step 640 a determination preferably is made whether a subsequent decoding iteration needs to be performed. If no subsequent decoding iteration is to be performed, the decoded data may be output at step 650. Otherwise, the process continues to step 660.

At step 660, prior soft information may be generated for each bit in the decoded data using an interleaved code. The prior soft information preferably is generated based on the reliability metrics associated with the information bits in the decoded symbols. A more detailed description of an illustrative process that may be employed at step 660 is described below with reference to process 660 in FIG. 6B. The process continues to step 680 where the prior soft information generated at step 680 may be provided to bias decoding in the next decoding iteration which begins at step 610. The received data to be decoded in subsequent iterations preferably corresponds to a delayed version of the received data processed in a preceding iteration.

In practice, one or more steps shown in process 600 may be combined with other steps, performed in any suitable order, performed in parallel (e.g., simultaneously or substantially simultaneously) or removed.

Figure 6B:
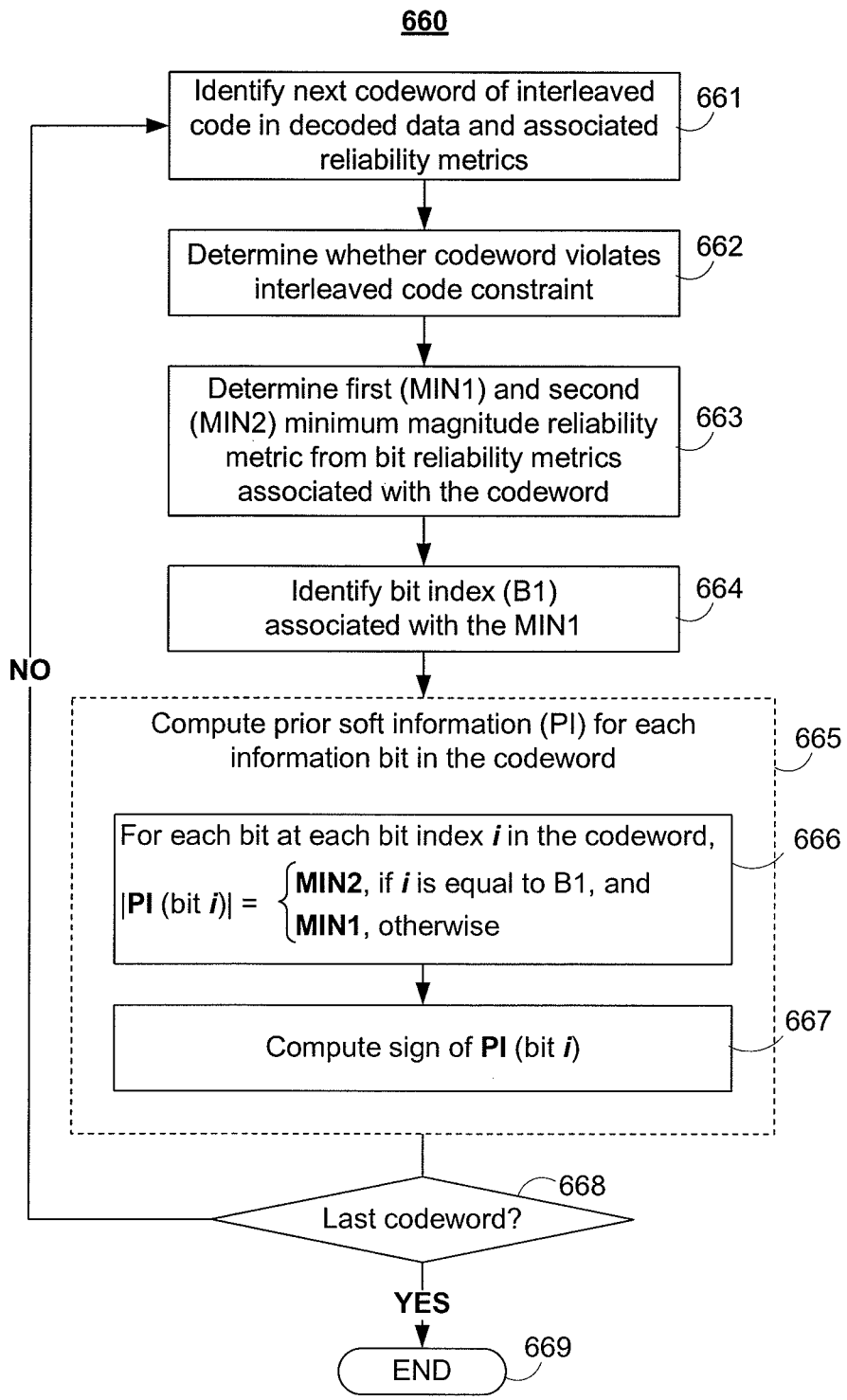
FIG. 6B shows illustrative process 660 for generating prior soft information that may be used in iterative decoding process 600 in accordance with one aspect of the invention.

FIG. 6B shows illustrative process 660 for generating prior soft information that may be used in iterative decoding process 600 in some embodiments of the invention. The process begins at step 661 where a codeword of the interleaved code and associated reliability metrics may be identified. A codeword may include information bits that constitute a symbol and parity information added to the symbol during encoding. The codeword may be identified based on an interleaving scheme used by the interleaved code based on which the decoded data was previously encoded. The process continues to step 662 where a determination is made whether the codeword violates a constraint associated with the interleaved code. For example, in an interleaved code that employs an even parity SPC check, a codeword violates the constraint if it has an odd parity. The process continues to step 663 where reliability metrics associated with the information bits in the codeword are searched to determine MIN1 and MIN2, which correspond to the smallest and second smallest magnitude reliability metrics associated with the codeword. At step 664 the bit index (B1) associated with MIN1 preferably is identified. Steps 662 to 664 may occur concurrently, in reverse order, or in any suitable order. The process continues to step 665 where prior soft information may be computed for each bit in the codeword. The prior soft information associated with each bit indicates the likelihood of error in the bit and preferably is used to bias subsequent decoding of the bit toward a particular value that is most likely to be the correct value of the bit. The soft information for each bit includes a magnitude and a sign, which are computed at steps 666 and 667, respectively. The magnitude of the soft information for each bit is set to MIN2 if the index of the bit corresponds to B1, and MIN1 otherwise. The sign of the soft information for each bit is set to maintain the sign of the bit if the codeword does not violate the interleaved code, and flipped if the codeword violates the interleaved code constraint. The process continues to step 668 where a determination is made whether more codewords remain to be processed. If more codewords remain, the process returns to step 661. Otherwise the process concludes at step 669.

In practice, one or more steps shown in process 660 may be combined with other steps, performed in any suitable order, performed in parallel (e.g., simultaneously or substantially simultaneously) or removed.

Referring now to FIGS. 7A-7G, various exemplary implementations of the present invention are shown.

Figure 7A:
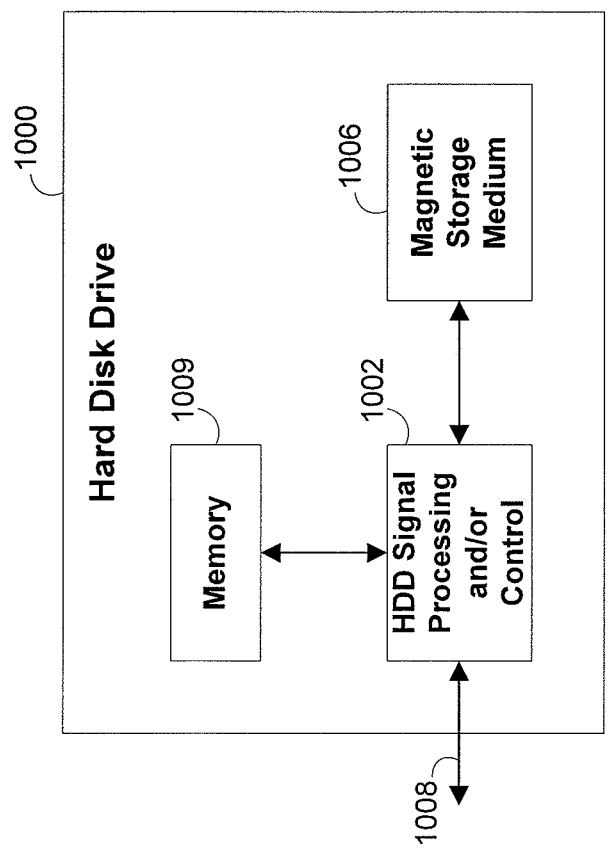
FIG. 7A is a block diagram of an exemplary hard disk drive that can employ the disclosed technology.

Referring now to FIG. 7A, the present invention can be implemented in a hard disk drive 1000. The present invention may implement either or both signal processing and/or control circuits, which are generally identified in FIG. 7A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 7B:
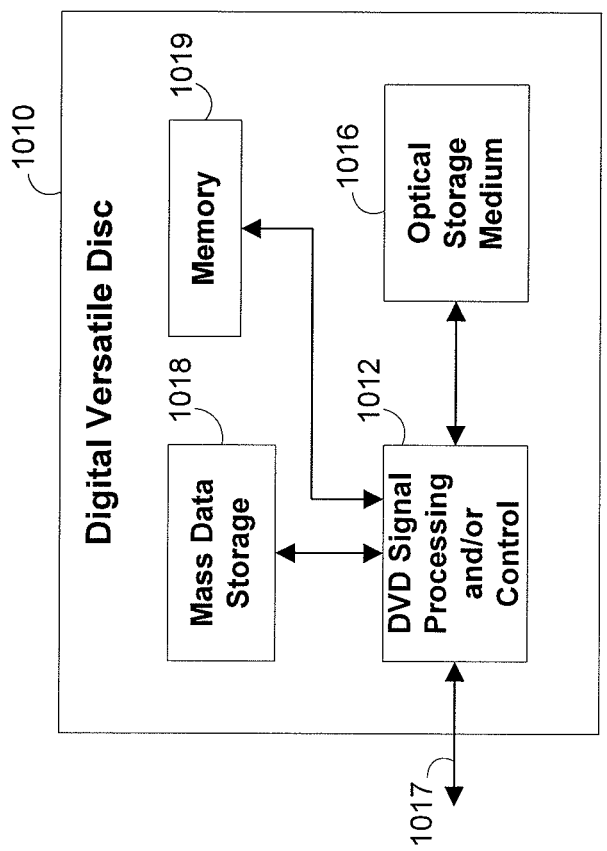
FIG. 7B is a block diagram of an exemplary digital versatile disc that can employ the disclosed technology.

Referring now to FIG. 7B, the present invention can be implemented in a digital versatile disc (DVD) drive 1010. The present invention may implement either or both signal processing and/or control circuits, which are generally identified in FIG. 7B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 7A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 7C:
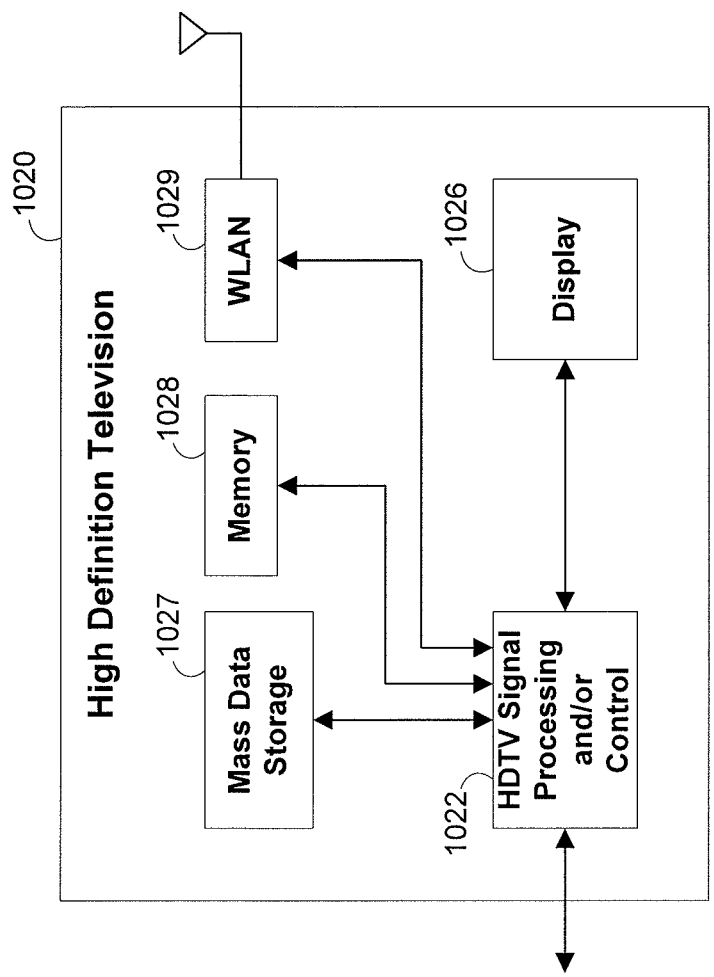
FIG. 7C is a block diagram of an exemplary high definition television that can employ the disclosed technology.

Referring now to FIG. 7C, the present invention can be implemented in a high definition television (HDTV) 1020. The present invention may implement either or both signal processing and/or control circuits, which are generally identified in FIG. 7C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 7A and/or at least one DVD may have the configuration shown in FIG. 7B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 7D:
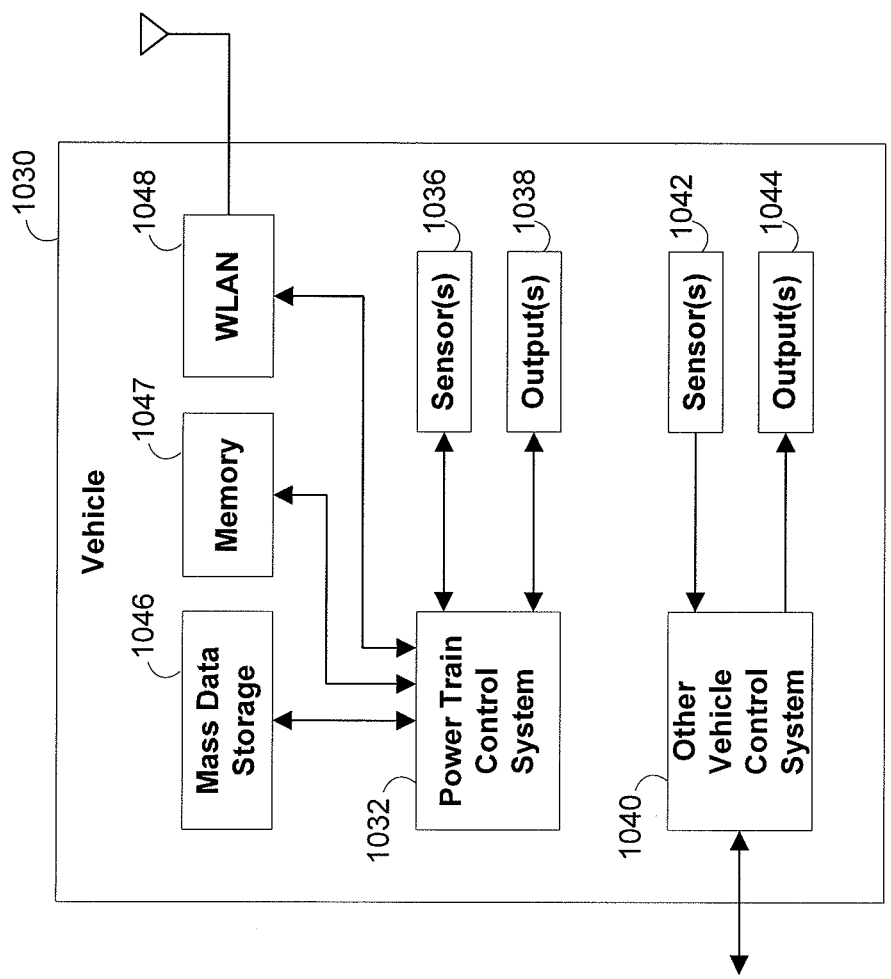
FIG. 7D is a block diagram of an exemplary vehicle that can employ the disclosed technology.

Referring now to FIG. 7D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 7E:
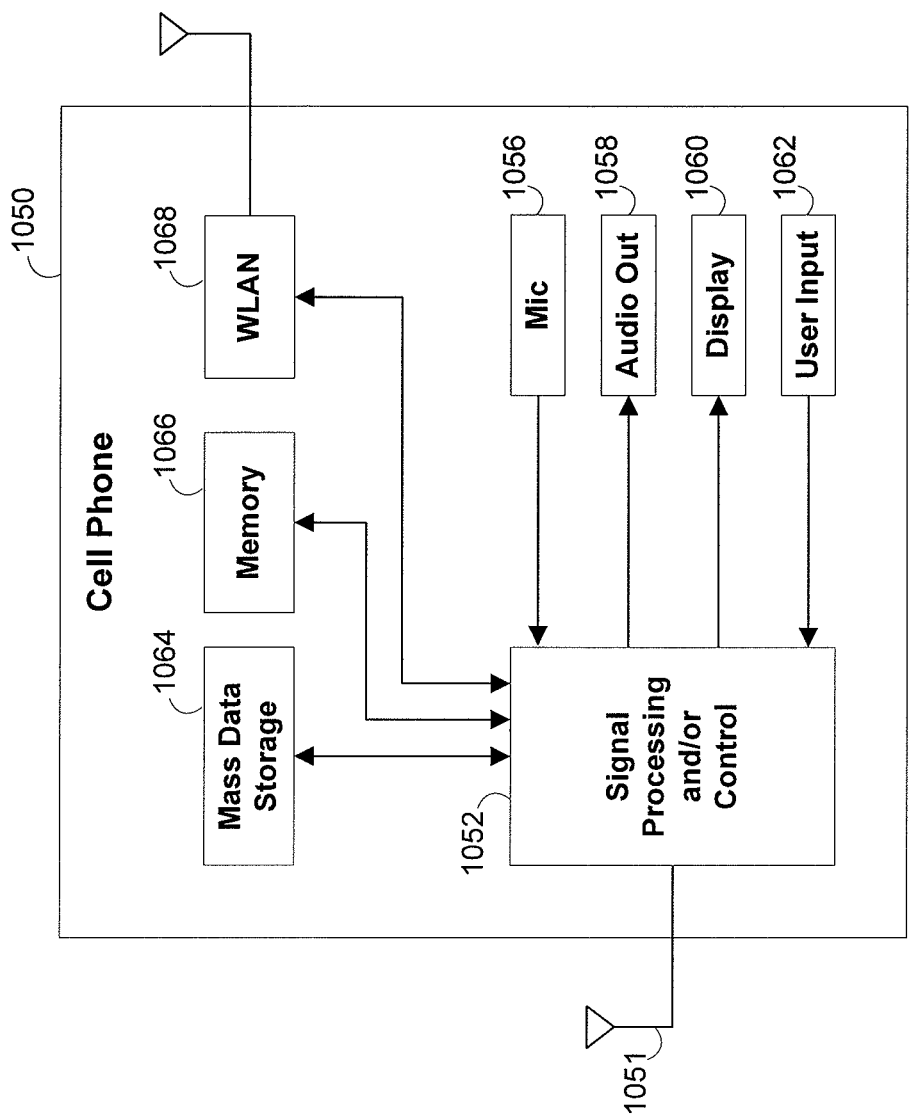
FIG. 7E is a block diagram of an exemplary cell phone that can employ the disclosed technology.

Referring now to FIG. 7E, the present invention can be implemented in a cellular phone 1050 that may include a cellular antenna 1051. The present invention may implement either or both signal processing and/or control circuits, which are generally identified in FIG. 7E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 7F:
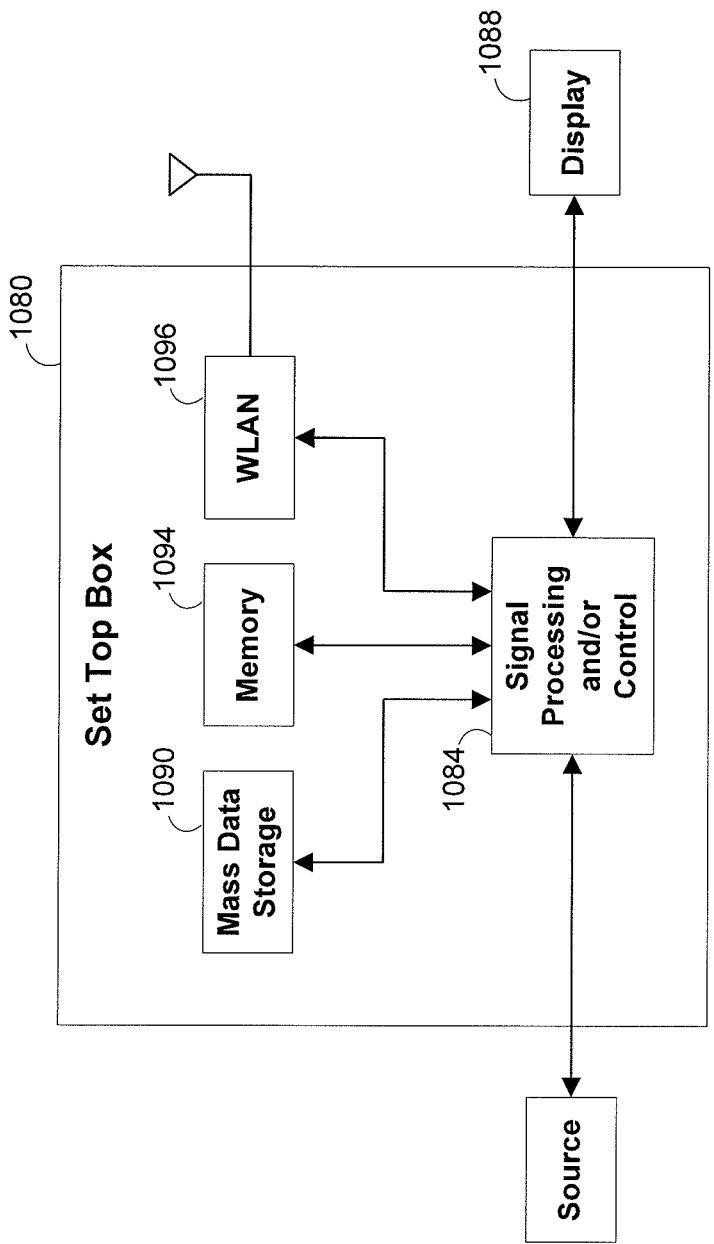
FIG. 7F is a block diagram of an exemplary set top box that can employ the disclosed technology.

Referring now to FIG. 7F, the present invention can be implemented in a set top box 1080. The present invention may implement either or both signal processing and/or control circuits, which are generally identified in FIG. 7F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 7G:
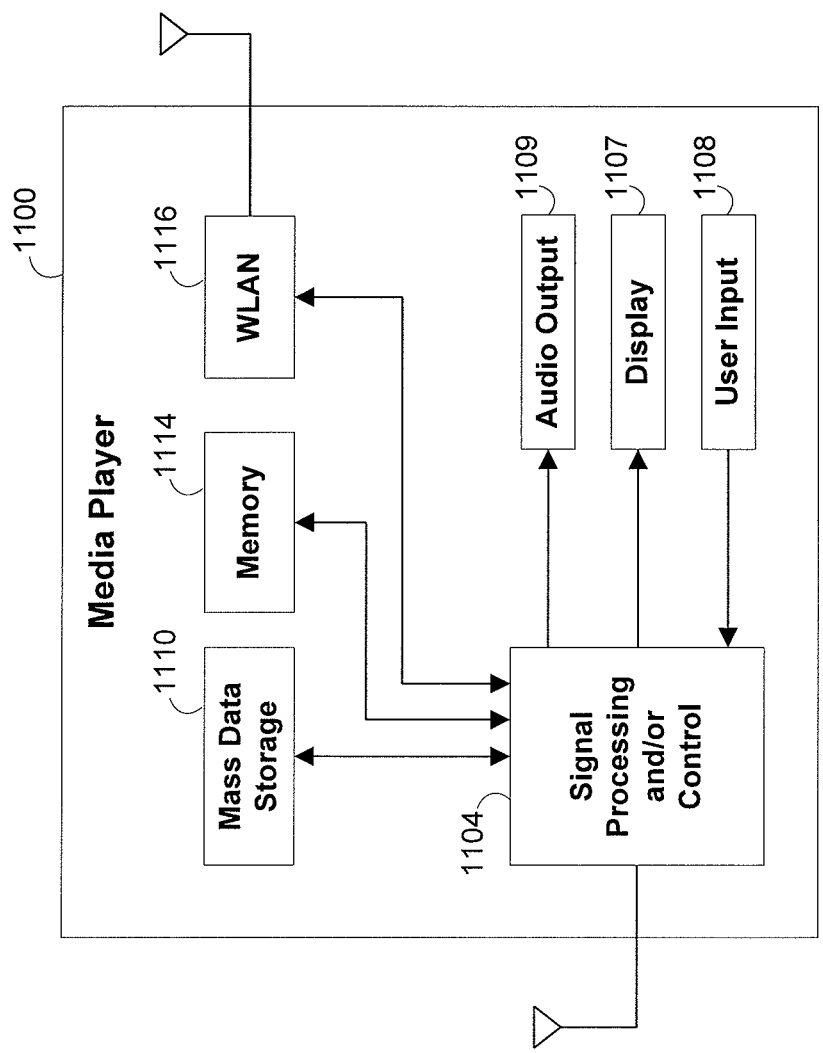
FIG. 7G is a block diagram of an exemplary media player that can employ the disclosed technology.

Referring now to FIG. 7G, the present invention can be implemented in a media player 1100. The present invention may implement either or both signal processing and/or control circuits, which are generally identified in FIG. 7G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Accordingly, systems and methods for encoding and decoding data based on an iterative code for error detection and correction are described. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed invention as defined by the following claims.

What is claimed is:

1. A method for encoding data, the method comprising:
   receiving input data to be encoded;
   encoding the input data along two dimensions based on an interleaved code to obtain first encoded data; and
   further encoding at least a portion of the first encoded data based on an embedded parity code to obtain second encoded data, wherein:
   the embedded parity code comprises an inner code and an outer code,
   the first encoded data comprises a plurality of symbols;
   the further encoding comprises generating at least one checksum for each of the plurality of symbols based on the inner code to obtain a plurality of symbol checksums; and
   the plurality of symbol checksums form a codeword in the outer code.

2. The method of claim 1, wherein encoding the input data based on an interleaved code comprises:
   arranging the input data into M data blocks, each including N bits, where M and N are integers greater than 0;
   generating at least N interleaved dataword sequences, wherein each bit in the input data is included in at least one interleaved dataword sequence and each interleaved dataword sequence includes at least one bit from each of the M data blocks; and
   computing a checksum for each of the at least N interleaved dataword sequences based on the interleaved code to obtain the first encoded data.

3. The method of claim 2, wherein:
   each of the at least N interleaved dataword sequences is an M-bit dataword comprising exactly one bit from each of the M data blocks; and
   adjacent bits in each of the dataword sequences are separated in the input data by a number of bits other than N.

4. The method of claim 1, wherein the interleaved code is an interleaved single parity check code or an interleaved low density parity check code.

5. The method of claim 1, wherein the further encoding comprises further encoding only a portion of the first encoded data that corresponds to the input data.

6. The method of claim 1, wherein the further encoding comprises further encoding first redundancy information generated based on the interleaved code and included in the first encoded data.

7. The method of claim 1, further comprising:
   receiving, with a decoder, a signal representative of at least some of the second encoded data; and
   determining the input data from the received signal.

8. The method of claim 7, wherein the determining the input data from the received signal comprises detecting the input data in the received signal using a soft output Viterbi algorithm (SOVA) or a Bahl Cocke Jelinek Raviv (BCJR) algorithm.

9. The method of claim 1, wherein the outer code is selected from the group consisting of a low density parity check code, a turbo code, a convolutional code, a small linear block code, and any suitable combination thereof.

10. An apparatus for encoding data for error detection or correction, the apparatus comprising:
    a receiving node that receives input data to be encoded;
    a first encoder that encodes the input data to obtain first encoded data, wherein the first encoder operates on a version of the input data that is interleaved along two dimensions; and
    a second encoder that further encodes at least a portion of the first encoded data to obtain second encoded data, wherein:
    the second encoder encodes based on an embedded parity code comprising an inner code and an outer code, and the second encoder is operative to generate at least one symbol checksum for each of a plurality of symbols in the input data based on the inner code to obtain a plurality of symbol checksums that form a codeword of the outer code.

11. The apparatus of claim 10 further comprising:
an interleaver that generates the interleaved version of the input data, wherein the input data comprises M data blocks, each including N bits, where M and N are integers greater than 0, the interleaved version comprising at least N interleaved dataword sequences, each bit in the input data being included in at least one of the dataword sequences, and each dataword sequence including at least one bit from each of the M data blocks.

12. The apparatus of claim 10, wherein the first encoder encodes based on a single-parity check code or a low density parity check code.

13. The apparatus of claim 10, wherein the outer code is selected from the group consisting of a low density parity check code, a turbo code, a convolutional code, a small linear block code, and any suitable combination thereof.

14. The apparatus of claim 10, further comprising a decoder that receives signals representative of at least some of the second encoded data, and that generates the input data from the received signal.

15. The apparatus of claim 14, wherein the decoder is further configured to provide bit reliability metrics associated with the generated input data.

16. The apparatus of claim 14, wherein decoder is further configured to generate the input data from the received signal based on detecting the input data in the received signal using a soft output Viterbi algorithm (SOVA) or a Bahl Cocke Jelinek Raviv (BCJR) algorithm.

17. The apparatus of claim 10, wherein the further encoding comprises further encoding first redundancy information generated based on the interleaved code and included in the first encoded data.

18. The apparatus of claim 10, wherein the further encoding comprises further encoding only a portion of the first encoded data that corresponds to the input data.

* * * * *